US 6,620,337 B1

(12) United States Patent
Ono et al.

(10) Patent No.: US 6,620,337 B1
(45) Date of Patent: Sep. 16, 2003

(54) COMPOSITE MAGNETIZER, COMPOSITE MAGNETIZER SHEET, AND METHODS OF MANUFACTURING THE SAME

(75) Inventors: Norihiko Ono, Tokyo (JP); Shigeyoshi Yoshida, Tokyo (JP)

(73) Assignee: Tokin Corporation, Sendai (JP)

( * ) Notice: Subject to any disclaimer, the term of this patent is extended or adjusted under 35 U.S.C. 154(b) by 0 days.

(21) Appl. No.: 09/694,304

(22) Filed: Oct. 24, 2000

(30) Foreign Application Priority Data

Oct. 25, 1999 (JP) .......................................... 11-302035

(51) Int. Cl.$^7$ ............................................... H01F 1/28
(52) U.S. Cl. ................... 252/62.54; 252/62.55
(58) Field of Search ........................ 252/62.54, 62.55

(56) References Cited

U.S. PATENT DOCUMENTS 5,258,350 A * 11/1993 Inoue et al. ................. 503/204
5,827,445 A * 10/1998 Yoshida et al. .......... 252/62.54

FOREIGN PATENT DOCUMENTS

EP 866649 * 9/1998

* cited by examiner

*Primary Examiner*—C. Melissa Koslow
(74) *Attorney, Agent, or Firm*—McGinn & Gibb, PLLC

(57) ABSTRACT

In a method of manufacturing a composite magnetizer, flat soft magnetic powder that strain is removed and magnetic coating of slurry regime consisting of a binder dissolved in a solvent are formed in a sheet by die-coating, gravure coating, or reverse coating. The binder includes a vinyl chloride resin with glass-transition temperature of not lower than 50° C.

16 Claims, 2 Drawing Sheets

COMPOSITE MAGNETIZER, COMPOSITE MAGNETIZER SHEET, AND METHODS OF MANUFACTURING THE SAME

BACKGROUND OF THE INVENTION

The present invention relates to an electromagnetic interference repressor for preventing unwanted electronic waves from leaking out of electronic equipments, or for providing interferences between internal circuits and influences of miss-operation caused by external electronic waves. In practically, the present invention relates to electromagnetic interference repressor formed by composite magnetizer consisting of organic binder having soft magnetic powder dispersed therein.

Recently, an importance of a measure devised to deal with electromagnetic environmental problems in electronic equipments is recognized increasingly. This is supported by a background in which many kinds of electronic equipments provide circuits with higher densification than before and both active and passive elements each consisting of a semiconductor device, and the like, which radiate dielectric noise are congested increasingly. These are because electronic devices such as digital electronic equipments and the like aim at responding to requirements of accelerating circuit signal processing speed, higher frequency, higher performances of multifunction, down sizing and lower profiling of product configuration, in the back ground.

As a result, it is often caused to occur that normal operation of equipments are disturbed. This is caused by increase of line-to-line coupling due to electrostatic coupling and electromagnetic coupling and also by interference of radiation noise. In some cases, the noise may affect other external equipments.

As countermeasures against noise caused by electronic devices with higher processing speed, more advanced function and higher density, particularly, a countermeasure against noise caused in quasi-microwave band, installation of low pass filter, shielding and the like can be taken. However, a countermeasure by components requires space for installation in the electronic device and needs to consider down sizing and low profiling in design phase. The counter measure by components is therefore not suitable for an urgent measure. In addition an inductance component contributes to real number portion magnetic permeability $\mu'$ and is insufficient for inductance in current quasi-microwave band. Further, in the event of conducting an inadvertent shielding, secondary electromagnetic coupling may be induced.

In response to the problems, the above-mentioned composite magnetizer sheet for repressing electromagnetic interference has been proposed as one of countermeasures against noise in quasi-microwave band. For example, proposals are made about composite magnetizer sheets capable of repressing electromagnetic interference in unexamined Japanese Patent Publication No. Hei 7-212079 and unexamined Japanese Patent Publication No. Hei 7-183911.

The above-mentioned composite magnetizer sheets correspond to quasi-microwave band and are capable of reducing permeability of radiation noise and secondary electromagnetic coupling as wave absorbers using high real number portion magnetic permeability $\mu'$ and imaginary number portion magnetic permeability $\mu''$ with a wide spectrum. Accordingly, it is possible to lighten the burden of the anti-noise measure and product development and to avoid impediments to achieve down sizing and higher densification of a circuit.

Further, in the market, a component of an anti-noise measure which is easy to use similar to the above-mentioned composite magnetizer and is capable of corresponding to retrofit components is required. The component of an anti-noise measure is preferred to have frequency band capable of component correspondence, that is, low frequency between about 10 to about 100 MHz in quasi-microwave band. Further, in the circumstance that down sizing of the electronic equipments is proceeding, the composite magnetizer sheet is required to have lower profiling corresponding to the above-mentioned quasi-microwave band.

The above-mentioned composite magnetizer sheet utilized for quasi-microwave band can provide less magnetic permeable ratio as the frequency becomes lower. Accordingly, providing lower profiling in configuration is limited and effect of repressing the electromagnetic interference reduces, as it is understood from the rise frequency of $\mu''$. As another anti-noise measure which may be taken in small electronic equipments such as a mobile communications equipment, and the like, installing ferrite or rubber ferrite may be acceptable in idea. However, in most events, ferrite can not be installed because of the problems of a possibility to be cracked or a difficulty of placement. On the other hand, rubber ferrite which has less possibility to be cracked can not repress noise sufficiently, even though a space for installation is reserved.

Components such as coils, filters, and the like are usable in the frequency of a lower side and a higher side than the spectrum between about 10 to about 100 MHz. However, currently, no anti-noise measure which is easy to be used in the above-mentioned frequency band is found. Even if a component corresponding to such an anti-noise measure is found, change of design of a substrate, and the like requires a great deal of costs and man-hour.

To solve these problems, it becomes necessary to provide a composite magnetizer sheet adoptable to the spectrum of lower frequency between about 10 to about 100 MHz and capable of expressing the electromagnetic interference repressing effect even in the lower profiling thereof.

In order to provide such a composite magnetizer sheet, it becomes indispensable to enhance magnetic permeability $\mu'$ and $\mu''$ and depress magnetic resonance frequency. In response to these requirements, for example, a proposal is made about a composite magnetizer sheet in which the repressing effect in FM band between about 10 to about 100 MHz is improved and which is adjusted to lower profiling in unexamined Japanese Patent Publication No. Hei 10-168273. Improvements of the electromagnetic interference repressing effect and lower profiling in configuration has been achieved by using the technologies disclosed in the above-mentioned unexamined Japanese Patent Publication.

Here, description is made about an example of methods for forming the above-mentioned composite magnetizer. As methods for forming the above-mentioned quasi-microwave band composite magnetizer sheet, there are a wet process in which a blended and agitated slurry regime admixture of flat soft magnetic powder, binder and solvent for dissolve the binder is formed in membrane by using doctor blade, and the like, and a dry process in which an admixture of flat soft magnetic powder and binder is kneaded by kneader, and the like, and is formed by roll, and the like.

Further, in the method for manufacturing a composite magnetizer disclosed in the above-mentioned unexamined Japanese Patent Publication No. Hei 10-168273, flat soft magnetic powder in which stress-strain is eliminated is formed in sheets by wet process in order not to cause a strain to the flat soft magnetic powder in the forming process and pressure is added on the sheet surfaces in vertical direction by press, thus high density is achieved. Accordingly, it is possible to enhance the electromagnetic interference repressing effect in FM band and to correspond to lower profiling.

Even though the effect of repressing noise with frequency between about 10 to about 100 MHz is enhanced and profiling of the configuration become lower by the method disclosed in unexamined Japanese Patent Publication No. Hei 10-168273, it is possible to obtain a composite magnetizer having electromagnetic interference repressing effect reserved therein. However the composite magnetizer obtained by the above-mentioned method provides flame resistance insufficiently.

In addition, magnetic permeable property can not be obtained sufficiently only by coating, and in the event the flat soft magnetic powder is pressed for increasing fill factor to reserve high magnetic permeability, the flat soft magnetic powder gets strain in the result and obtaining property required is difficult.

Further, the composite magnetizer sheet disclosed in unexamined Japanese Patent Publication No. Hei 10-168273 with the thickness of more than 0.3 mm is poor in flexibility and provides less mechanical strength as the thickness become smaller in coating process, thus handling in the post processing becomes difficult.

Further more, in the above-mentioned composite magnetizer, phenomenon of secular changes caused by moisture penetration inside, in concrete, depression of density is found and coating of binder on the surface is required to improve high temperature high humidity resistance, regardless of the thickness.

Moreover, according to the above-mentioned dry process, flat soft magnetic powder in which strain is removed is supplied with the strain again. It is thereby difficult to obtain desirable characteristics.

SUMMARY OF THE INVENTION

It is therefore an object of the present invention to provide a composite magnetizer (e.g., "composite magnetic material") for electromagnetic interference repressor (e.g., "suppressor") and a method of manufacturing the composite magnetizer and electromagnetic interference repressing effect are reserved and in which flame resistance and mechanical strength are provided, sufficiently therein by filling the flat soft magnetic powder, in which strain is removed, with high density.

Other objects of the present invention will become clear as the description proceeds.

According to an aspect of the present invention, there is provided a method of manufacturing a composite magnetizer in which flat soft magnetic powder that strain is removed and a binder are blended and kneaded to obtain an admixture, the admixture being formed in a sheet by molding means selected from the group consisting of roll molding, injection molding, and extrusion molding, characterized in that the binder includes a vinyl chloride resin with glass-transition temperature of not lower than 50° C.

The binder may be a mixture of chlorinated polyethylene and vinyl chloride resin with glass-transition temperature of not lower than 50° C.

The contents of vinyl chloride monomer in the vinyl chloride resin is between about 75 to about 90 mol %.

The mixing ratio of the chlorinated polyethylene and the vinyl chloride resin is between about 4:1 to about 1:4 in weight.

The flat soft magnetic powder may be oriented and arrayed in-plane direction of the composite magnetizer sheet (e.g., "composite magnetic sheet") and bulk density (e.g., "packed density") of the flat soft magnetic powder may be enhanced by applying roll working to the composite magnetizer sheet using a device selected from the group consisting of a reduction roll device, a calendar roll device, and a pressing device.

The reduction roll device and the calendar roll device may be provided with a roll which is made of a material selected from the group consisting of a rubber with rubber strength (e.g., "rubber hardness") of not smaller than 90, and a polymeric material.

A composite magnetizer or a composite magnetizer sheet may be manufactured by the method.

According to another aspect of the present invention, there is also provided a method of manufacturing a composite magnetizer in which flat soft magnetic powder that strain is removed and magnetic coating of slurry regime consisting of a binder dissolved in a solvent are formed in a sheet by coating means selected from the group consisting of die-coating, gravure coating, and reverse coating, characterized in that the binder includes a vinyl chloride resin with glass-transition temperature of not lower than 50° C.

The binder may be a mixture of chlorinated polyethylene and vinyl chloride resin with glass-transition temperature of not lower than 50° C.

The contents of vinyl chloride monomer in the vinyl chloride resin is between about 75 to about 90 mol %.

The mixing ratio of the chlorinated polyethylene and the vinyl chloride resin is between about 4:1 to about 1:4 in weight.

The flat soft magnetic powder may be oriented and arrayed in-plane direction of the composite magnetizer sheet and bulk density of the flat soft magnetic powder may be enhanced by applying roll working to the composite magnetizer sheet using a device selected from the group consisting of a reduction roll device, a calendar roll device, and a pressing device.

The reduction roll device and the calendar roll device may be provided with a roll which is made of a material selected from the group consisting of a rubber with rubber strength of not smaller than 90, and a polymeric material.

A composite magnetizer or a composite magnetizer sheet may be manufactured by the method.

The flat soft magnetic powder used in the present invention can be obtained in a flattened shape by applying mechanical grinding to spherical or indefinite shaped coarse powder. In the process of grinding, strain is generated in the flat soft magnetic powder to deteriorate characteristics of the powder. However, the above-mentioned strain can be removed by conducting anneal process. It is necessary to conduct the anneal process so as to obtain the flat soft magnetic powder having desired characteristics. The conditions of the anneal process are determined, dependent on the materials of the soft magnetic powder as appropriate.

As mentioned above, there are dry process and wet process for forming the admixture of flat soft magnetic powder and binder in a sheet. The wet process is more preferable for reducing the load of external force onto the flat soft magnetic powder. In the present invention, composite magnetizer in which a flat direction of soft magnetic powder is oriented to in-plane direction of a sheet can be obtained by forming a membrane by die-coating, gravure coating or reverse coating.

In the present invention, vinyl chloride resin with glass-transition temperature of 50° C. or more is used as a binder. Therefore, strength of binder at room temperature is increased. It becomes easier to handle the composite magnetizer in the work process.

The contents of chlorine in the binder are increased by using vinyl chloride resin. Thereby, flame resistance is enhanced. Further, high temperature and high humidity resistance of the composite magnetizer can be improved, since polyvinyl chloride has lower water vapor permeability than polyethylene.

In the present invention, the most preferable value of content of vinyl chloride monomer in the vinyl chloride resin for expressing the above-mentioned effect sufficiently is between about 75 to about 90 mol % and mixing ratio of chlorinated polyethylene and vinyl chloride resin is between about 4:1 to about 1:4 in weight.

It is effective to enhance the density of the composite magnetizer for obtaining the composite magnetizer with high magnetic permeability. High density can be implemented by applying roll working on the sheet after forming in membrane and removing the solvent. Therefore, in the method of manufacturing the composite magnetizer sheet of the present invention, a surface of the composite magnetizer sheet is pressed vertically by rolling device utilizing press or roll. The pressing brings a has secondary effect to enhance orientation extent of the flat soft magnetic powder.

During the above-mentioned process, if the press work is applied to the composite magnetizer inadvertently, strain is again generated in the flat soft magnetic powder. Therefore, a rolling device providing a roll consisting of rubber with rubber strength of not less than 90 or consisting of polymeric material is used in the present invention.

DETAILED DESCRIPTION OF THE PREFERRED EMBODIMENT

Figure 1:
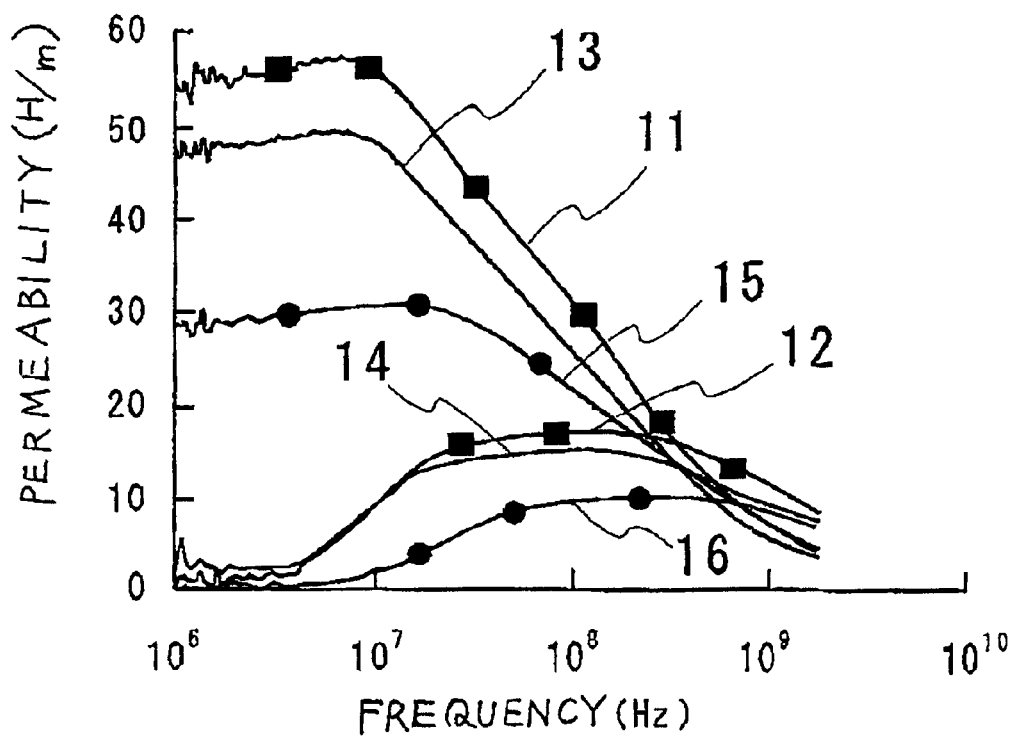
FIG. 1 is a diagram for showing the result of evaluation of relative magnetic permeability of a composite magnetizer according to a preferred embodiment of the present invention.

Referring to FIGS. 1 through 4, description will proceed to a composite magnetizer, a composite magnetizer sheet, and a method of manufacturing the composite magnetizer and the composite magnetizer sheet according to a preferred embodiment of the present invention.

At first, an Fe—Al—Si alloy powder having an average diameter of 35 μm and an aspect ratio of not less than 5 is prepared as flat soft magnetic powder. The flat soft magnetic powder is subjected to the heat treatment for two hours on condition that temperature is kept at 650° C. in order to remove the strain thereof.

85 weight % of the flat soft magnetic powder, 14 weight % of binder in which chlorinated polyethylene and vinyl chloride resin are blended with weight ratio of 4:1, 1 weight % of titanate coupling agent, and 200 weight % of toluene as solvent are weighed out, respectively.

By putting all of the above-mentioned materials into a mixer to be agitated therein, the flat soft magnetic powder is subjected to a surface treatment by the coupling agent. In addition, the binder is dissolved in a solvent. A slurry for forming the composite magnetizer is thereby obtained. In this embodiment of the present invention, the binder is dissolved in the solvent to be mixed with other materials, so that the strain is not added to the flat soft magnetic powder.

Incidentally, the vinyl chloride resin used in this embodiment has contents of vinyl chloride monomer of between about 75 to about 90 weight % and a glass-transition temperature of not lower than 50° C. The vinyl chloride resin contributes not only to enhancing the flame resistance of the composite magnetizer but also to improving the workability of roll forming.

Next, the above-mentioned slurry is formed by die-coating in a membrane with a flat surface of the flat soft magnetic powder being oriented in-plane direction, so that a composite magnetizer sheet is fabricated. The composite magnetizer sheet produced in the above-mentioned operation has the thickness of about 0.08 mm. Magnetic field orientation may be conducted to orient the flat soft magnetic powder with a greater extent before the elimination of the solvent in the process. Coating by gravure coating or reverse coating is also acceptable.

In addition, composition of the above-mentioned binder is determined in consideration of the flexibility of the composite magnetizer. However, when the composite magnetizer can be more rigid, the mixing ratio of chlorinated polyethylene and vinyl chloride resin may be 1:4 in weight. It is possible to obtain composite magnetizer providing voluntary mechanical strength and flexibility by adjusting the ratio between about 1:4 to about 4:1. Accordingly, configuration of products becomes various. For example, when a very thin composite magnetizer with the thickness of not more than 0.1 mm is manufactured, blending a larger amount of vinyl chloride resin is preferable in consideration of workability in a later process.

Besides, if the mixing ratio of chlorinated polyethylene and vinyl chloride resin is beyond the range as mentioned above, undesirable effects are caused to occur. Namely, when vinyl chloride resin is too much, the flexibility becomes short. On the other hand, when chlorinated polyethylene is too much, not only the mechanical strength of the composite magnetizer becomes short but also the flame resistance becomes smaller.

Figure 2:
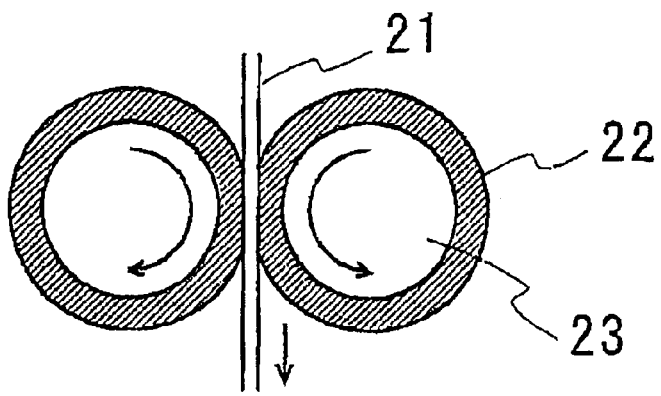
FIG. 2 is a schematic diagram for showing a dual axis reduction roll used in a rolling process in the preferred embodiment of the present invention.

Then, the above-mentioned composite magnetizer sheet 21 is subjected to roll working by using the dual axis reduction roll illustrated in FIG. 2. Rolling is conducted on conditions that roll spaces are determined to be substantially 0 and that temperature is kept at 50° C. layer 22 consisting of rubber with rubber hardness of not smaller than 90 or of polymeric material is formed around the surface of a metallic roll 23 in the roll illustrated in FIG. 2. Herein, rubber hardness thus mentioned is the value of international rubber hardness measured by rubber hardness testing method standardized in JIS, K6253.

Figure 3:
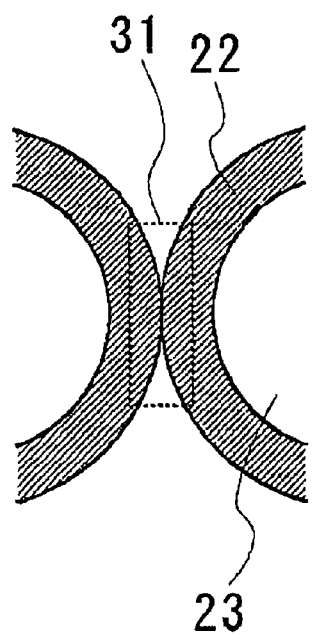
FIG. 3 is a schematic diagram for showing the dual axis reduction roll used in the rolling process in which the dual axis reduction roll is press-welded and deformed.

FIG. 3 is a view for showing the layer 22 consisting of rubber or polymeric material illustrated in FIG. 2 is press-welded. Since the portion is elastically deformed, a contact portion 31 of a certain extent of area is formed by the deformation as shown in FIG. 3. Accordingly, the composite magnetizer sheet rolled in the portion is rolled evenly without receiving high pressure locally. Consequently, strain is not added to the flat soft magnetic powder.

Therefore, it is possible to make the composite magnetizer sheet be rolled without shifting magnetic resonance frequency fr to a higher frequency side and inducing the reduction of relative magnetic permeability $\mu'$ and $\mu''$. By roll working, the density of the composite magnetizer sheet becomes 1.5 times of the density before rolling.

In FIG. 1, illustrated is a result of measurement of the relative magnetic permeability characteristics of the composite magnetizer sheet. In FIG. 1, reference numerals 11 and 12 show $\mu'$ and $\mu''$ after the roll working by the roll of the above-mentioned composite magnetizer sheet, respectively. On the other hand, reference numerals 13 and 14 show $\mu'$ and $\mu''$ before the roll working by the roll of the above-mentioned composite magnetizer sheet, respectively. In addition, reference numerals 15 and 16 show $\mu'$ and $\mu''$ of the composite magnetizer sheet fabricated by a dry process, respectively. The reference numerals 15 and 16 are described for comparison.

As clearly shown in FIG. 1, in the composite magnetizer sheet according to this embodiment of the present invention, enhancement of the relative magnetic permeability characteristics by the roll working is confirmed. On the other hand, in the composite magnetizer sheet fabricated by a dry process, deterioration of the magnetic permeability characteristics is confirmed, which is understood to be due to the strain added to the flat soft magnetic powder.

Further, although description is herein made about a roll device with dual axis roll, calendar roll device or a pressing device is also usable as a roll device. In this case, it is necessary to form a layer consisting of a rubber with rubber hardness of not smaller than 90 or a polymeric material in a roll provided with the above-mentioned calendar roll device. It is possible to fabricate the composite magnetizer sheets thickened by piling a larger numbers of the sheets by the use of a pressing device, compared with the event of using a roll device having rolls therein.

Figure 4:
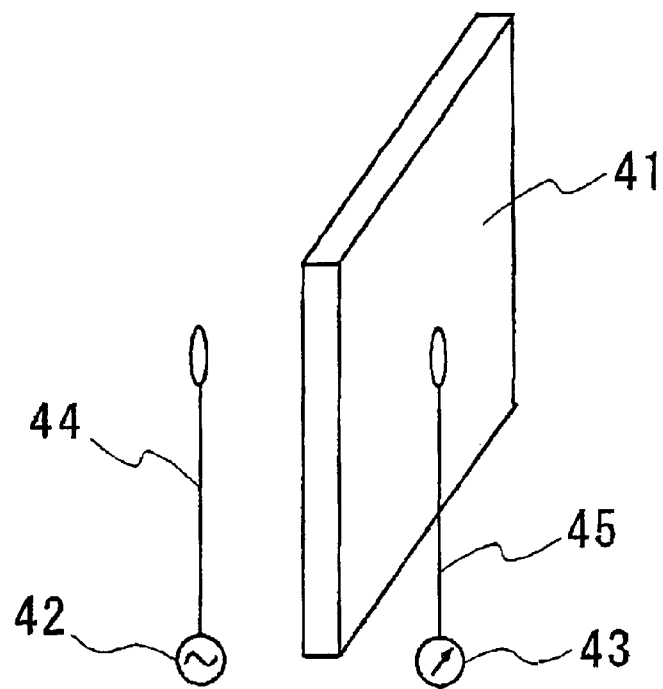
FIG. 4 is a schematic diagram for showing a device for evaluating electromagnetic interference repressing effect of the composite magnetizer according to the preferred embodiment of the present invention.

Next, referring to FIG. 4, description proceeds to an electromagnetic interference repressing effect of the composite magnetizer sheet according to this embodiment of the present invention in comparison with that manufactured by a dry process. FIG. 4 is a view for showing the outline of the device used for evaluation of the electromagnetic interference repressing effect. The measuring device comprises a oscillator for electromagnetic field wave source 42, an electromagnetic intensity measuring instrument (spectrum analyzer) 43, a micro loop antenna 44 for transmitting electromagnetic field, and a micro loop antenna 45 for receiving electromagnetic field, both of which have a diameter of not longer than 2 mm, respectively. Therein, the composite magnetizer sheet 41 of this embodiment is located between the two micro loop antennas. Damping effect is measured in permeation with reference to the event without the composite magnetizer sheet. In those cases, composite magnetizer sheets with the thickness of 0.3 mm and 0.5 mm are used. The result is shown in the following table.

| frequency | 50 MHz | 200 MHz |
|---|---|---|
| The present embodiment (the thickness of 0.5 mm) | −17 dB | −13 dB |
| The present embodiment | −12 dB | −9 dB |

-continued

| frequency | 50 MHz | 200 MHz |
|---|---|---|
| (the thickness of 0.3 mm) By a dry process (the thickness of 0.5mm) | −10 dB | −8 dB |

As shown in the above table, an electromagnetic interference repressing effect obtained in the composite magnetizer sheet of this embodiment having the thickness of 0.3 mm is almost equal to the value provided by the composite magnetizer sheet having the thickness of 0.5 mm fabricated by a dry process.

Herein, description is made about only the composite magnetizer fabricated by the so-called wet process. However, flame resistance and mechanical strength can be achieved sufficiently in the composite magnetizer fabricated by a dry process, similarly to those of the composite magnetizer fabricated by the wet process. Even the relative magnetic permeability characteristics are improved by applying the rolling method of the present invention. However, the relative magnetic permeability characteristics before and after the rolling are inferior in values to those of the composite magnetizer fabricated by the wet process.

As described above in detail, according to the present invention, a composite magnetizer in which flat soft magnetic powder free from strain is highly filled and can be obtained without adding the strain to the flat soft magnetic powder again in the manufacturing process. Accordingly, lower profiling of the composite magnetizer can be achieved. Further, the electromagnetic interference repressing effect in the frequency band between about 10 to about 100 MHz of the composite magnetizer can be improved.

Moreover, the composite magnetizer according to the present invention has flame resistance and a high mechanical strength. Therefore, the composite magnetizer according to the present invention requires no reinforcing agent for coating the surface thereof. Even a composite magnetizer having a small thickness can be handled easily.

What is claimed is:

1. A composite magnetic material, comprising:
   a flat soft magnetic powder with a strain removed; and
   a binder which includes a mixture of a chlorinated polyethylene and a vinyl chloride resin with a glass-transition temperature of not lower than 50° C.

2. The composite magnetic material according to claim 1, wherein said vinyl chloride resin contains 75 through 90 mol % of a vinyl chloride monomer.

3. The composite magnetic material according to claim 2, wherein said chlorinated polyethylene and said vinyl chloride resin are mixed in a ratio of 1:0.25 through 1:4 weight.

4. A composite magnetic sheet comprising said composite magnetic material according to claim 1, wherein said composite magnetic sheet comprises a molded composite magnetic sheet, said molded composite magnetic sheet comprising one of a roll molded sheet, an injection-molded sheet, and an extrusion molded sheet.

5. The composite magnetic sheet according to claim 4, wherein said composite magnetic sheet is subject to a rolling process, which comprises one of a reduction roll, a calendar roll and a press, and
   wherein said flat soft magnetic powder is oriented and arrayed in a plane-direction of said composite magnetic sheet and said composite magnetic sheet has an enhanced packed density of said flat soft magnetic powder after said rolling process.

6. The composite magnetic sheet according to claim 5, wherein said rolling process uses one of a reduction roll device and a calender roll device provided with a roll having a layer of rubber or polymer with rubber hardness of not smaller than 90.

7. A composite magnetic coating slurry comprising:

a flat soft magnetic powder with the strain removed;

a binder which includes a mixture of a chlorinated polyethylene and a vinyl chloride resin with a glass transition temperature of not lower than 50° C.; and a solvent for dissolving said binder.

8. A composite magnetic sheet made of said composite magnetic coating slurry according to claim 7, wherein said composite magnetic sheet has been formed by one of a die-coating, a gravure coating and a reverse coating.

9. The composite magnetic sheet according to claim 8, wherein said composite magnetic sheet is subject to a rolling process, which comprises one of a reduction roll, a calendar roll and a press, and wherein said flat soft magnetic powder is oriented and arrayed in a plane-direction of said composite magnetic sheet and said composite magnetic sheet has an enhanced packed density of said flat soft magnetic powder after said rolling process.

10. The composite magnetic sheet according to claim 9, wherein said rolling process uses one of a reduction roll device and a calender roll device provided with a roll having a layer of rubber or polymer with rubber hardness of not smaller than 90.

11. The composite magnetic coating slurry according to claim 7, wherein said vinyl chloride resin contains 75 through 90 mol % of a vinyl chloride monomer.

12. The composite magnetic coating slurry according to claim 11, wherein said chlorinated polyethylene and said vinyl chloride resin are mixed in a ratio of 1:025 through 1:4 in weight.

13. A method of manufacturing a composite magnetic sheet comprising:

blending and kneading a strainless flat soft magnetic powder and a binder to obtain an admixture; and forming said admixture into a composite magnetic sheet by one of roll molding, injection molding, and extrusion molding, wherein said binder includes a mixture of a chlorinated polyethylene and a vinyl chloride resin with a glass-transition temperature of not lower than 50° C.

14. The method of claim 13, wherein a content of vinyl chloride monomer in said vinyl chloride resin is between about 75 to about 90 mol %.

15. A method of manufacturing a composite magnetic sheet comprising:

mixing a strainless flat soft magnetic powder and a binder dissolved in a solvent to obtain a coating slurry; and forming said coating slurry into a composite magnetic sheet by one of a die-coating, a gravure coating and a reverse coating, wherein said binder includes a mixture of a chlorinated polyethylene and a vinyl chloride resin with a glass-transition temperature of not lower than 50° C.

16. The method of claim 15, wherein a content of vinyl chloride monomer in said vinyl chloride resin are between about 75 to about 90 mol %.

* * * * *